(12) United States Patent
Lee et al.

(10) Patent No.: US 8,773,914 B2
(45) Date of Patent: Jul. 8, 2014

(54) SEMICONDUCTOR MEMORY DEVICE AND RELATED METHODS FOR PERFORMING READ AND VERIFICATION OPERATIONS

(75) Inventors: Hwa-seok Lee, Suwon-si (KR); Bo-geun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 13/116,036

(22) Filed: May 26, 2011

(65) Prior Publication Data

US 2011/0305091 A1    Dec. 15, 2011

(30) Foreign Application Priority Data

Jun. 10, 2010    (KR) .................. 10-2010-0055117

(51) Int. Cl.
*G11C 11/34*    (2006.01)
(52) U.S. Cl.
USPC ..................................... 365/185.22

(58) Field of Classification Search
USPC ..................................... 365/185.22
See application file for complete search history.

(56) References Cited

U.S. PATENT DOCUMENTS

| 7,570,531 B2 * | 8/2009 | Nakamura et al. ............ 365/207 |
| 2009/0010067 A1 * | 1/2009 | Lee ......................... 365/185.19 |
| 2010/0214862 A1 * | 8/2010 | Kim et al. .................... 365/226 |

FOREIGN PATENT DOCUMENTS

| JP | 2000-100186 | 4/2000 |
| JP | 2001-023387 | 1/2001 |
| KR | 10-0706247 | 4/2007 |

\* cited by examiner

*Primary Examiner* — Anthan Tran
(74) *Attorney, Agent, or Firm* — Volentine & Whitt, PLLC

(57) ABSTRACT

A semiconductor memory device comprises a memory cell array configured to store data, a sensing unit configured to perform a read operation the memory cell array by sensing a bitline in a plurality of reading steps in response to a single read command, and a sensing time controller configured to generate a control signal to control a variable reading time for each reading step of the sensing unit.

9 Claims, 13 Drawing Sheets

FIG. 10
(a)
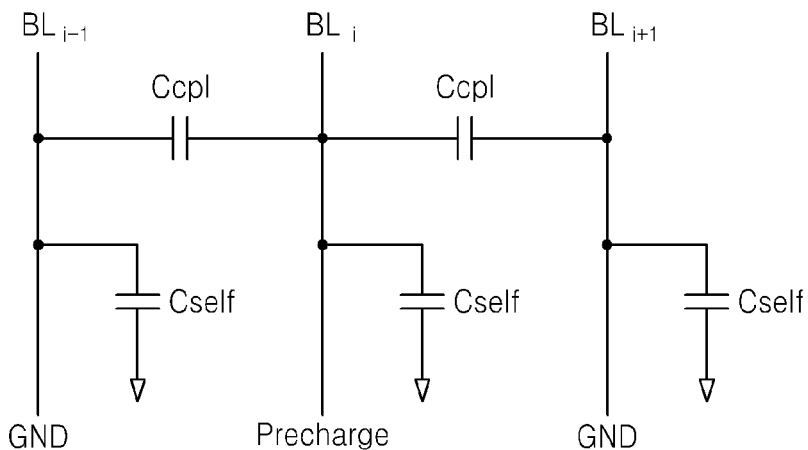
(b)
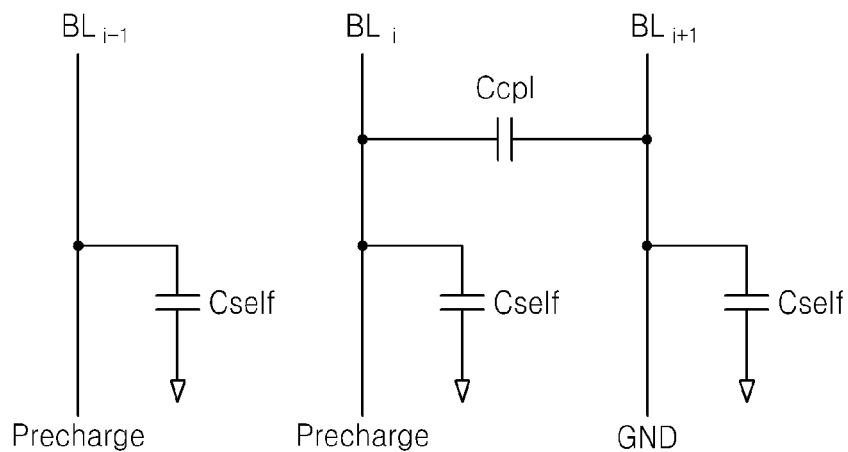
(c)
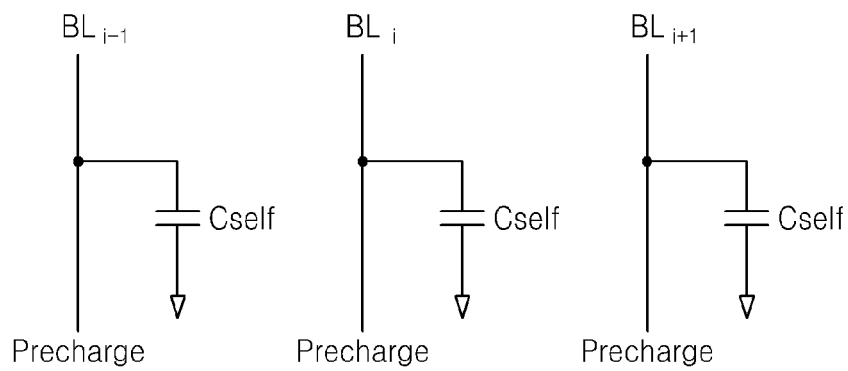

SEMICONDUCTOR MEMORY DEVICE AND RELATED METHODS FOR PERFORMING READ AND VERIFICATION OPERATIONS

CROSS-REFERENCE TO RELATED APPLICATIONS

This application claims priority under 35 U.S.C. §119 to Korean Patent Application No. 10-2010-0055117 filed on Jun. 10, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to semiconductor memory devices and methods of performing read and verification operations in the semiconductor memory devices.

Recent years have been marked by a continuing increase in the demand for semiconductor memory devices. Along with this demand, there has also been a demand for improved performance and increased storage capacity of the semiconductor memory devices.

Two of the primary ways of improving the performance and storage capacity of semiconductor memory devices are increasing their operating speeds, and increasing their integration densities. Increasing these characteristics, however, can require improvements in the precision of their operations because devices that are faster and smaller tend to be more sensitive to minor variations in operating conditions such as timing, voltages, and so on. As a result, new techniques are continually required to ensure the reliability of next generation semiconductor memory devices.

SUMMARY OF THE INVENTION

According to one embodiment of the inventive concept, a semiconductor memory device comprises a memory cell array configured to store data, a sensing unit configured to perform a reading operation on data stored in the memory cell array by sensing a corresponding bitline through a plurality of reading steps in response to a single reading command, and a sensing time controller configured to generate a control signal to variably control a reading time taken by each reading step performed by the sensing unit.

According to another embodiment of the inventive concept, a semiconductor memory system comprises a semiconductor memory device comprising a memory cell array configured to store data, a sensing unit configured to perform a reading operation of data stored in the memory cell array by sensing a corresponding bitline through a plurality of reading steps according to a single reading command, and a sensing time controller configured to generate a control signal to control a reading time taken by each reading step of the sensing unit to vary between the different reading steps.

According to still another embodiment of the inventive concept, a nonvolatile semiconductor device comprises a memory cell array, a sensing unit configured to receive a reading command to initiate a reading operation comprising a plurality of reading steps, a sensing time controller configured to receive a reading step signal indicating a number of a current reading step of the reading operation, and further configured to generate a control signal to variably control a timing of the current reading step. The reading time taken by the current reading step comprises a discharging time taken to discharge bitlines of the memory cell array, a precharging time taken to precharge the discharged bitlines among the precharged bitlines, a developing time taken to develop a voltage of the corresponding bitline, or a latch time taken to latch the developed bitline voltage.

These and other embodiments can be used to improve the reliability of read data while performing read and verify operations at high speeds.

BRIEF DESCRIPTION OF THE DRAWINGS

The drawings illustrate selected embodiments of the inventive concept. In the drawings, like reference numbers indicate like features.

FIGS. 9 and 10 are diagrams for describing a reading time controlled by a sensing time controller of FIG. 8.

DETAILED DESCRIPTION

Embodiments of the inventive concept are described below with reference to the accompanying drawings. These embodiments are presented as teaching examples and should not be construed to limit the scope of the inventive concept.

Figure 1:
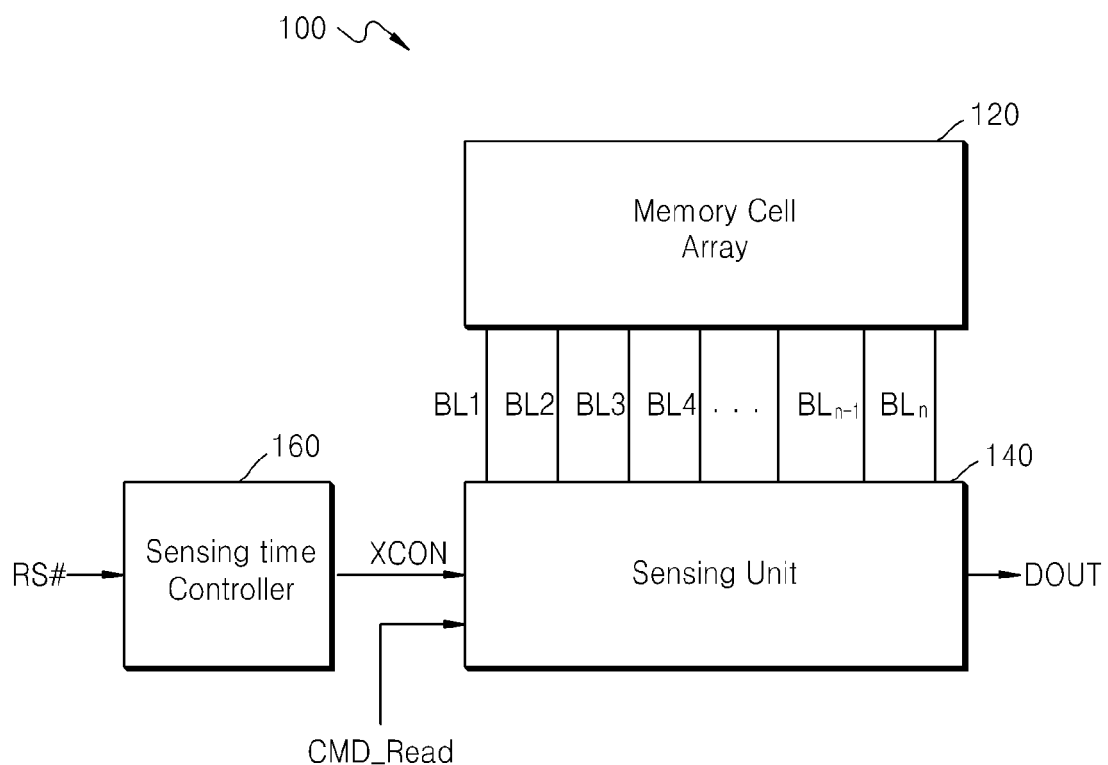
FIG. 1 is a block diagram of a semiconductor memory device according to an embodiment of the inventive concept.

FIG. 1 is a block diagram of a semiconductor memory device 100 according to an embodiment of the inventive concept. For explanation purposes, it will be assumed that semiconductor memory device 100 is a NAND flash memory device. However semiconductor memory device 100 can take other forms, such as a NOR flash memory device or another type of nonvolatile memory.

Referring to FIG. 1, semiconductor memory device 100 comprises a memory cell array 120, a sensing unit 140, and a sensing time controller 160.

Memory cell array 120 is used to store data, and it comprises a plurality of strings in which a plurality of memory cells are connected to corresponding bitlines BL1, BL2, . . . , BLn. Bitlines BL1, BL2, . . . , BLn shown in FIG. 1 are arranged in pairs. For example, a first bitline BL1 and a second bitline BL2 constitute a bitline pair.

In a read operation, semiconductor memory device 100 senses a voltage difference between two bitlines in a bitline pair to read data stored in a corresponding memory cell of memory cell array 120. As an example, semiconductor memory device 100 can sense a voltage difference between first bitline BL1 and second bitline BL2 to read a corresponding memory cell of memory cell array 120.

Sensing unit 140 is used to perform sensing in the above read operation. Where semiconductor memory device 100 is a flash memory device, sensing unit 140 can be included in a page buffer unit, for example. In addition to performing sensing in a read operation, the page buffer can also drive bitlines in a program operation. However, for convenience of description, only a sensing operation will be described.

Sensing unit 140 discharges and precharges bitlines BL1, BL2, . . . , BLn before sensing a bitline pair of a selected memory cell to be read. Where a read command CMD_Read is applied to sensing unit 140, sensing unit 140 develops a voltage of a selected bitline. Moreover, sensing unit 140 can perform multiple reading steps in response to a single read command CMD_Read. Examples of the multiple reading steps are described in further detail below.

Sensing unit 140 senses whether the selected memory cell is an off-cell or an on-cell based on the developed voltage on the selected bitline. Based on this sensing, sensing unit 140 determines a data value stored in the selected memory cell. The determined value is then output via a latch (not shown). Although sensing unit 140 directly outputs reading data DOUT in the embodiment of FIG. 1, semiconductor memory device 100 can be modified to incorporate an alternative input/output circuit (not shown) for outputting data sensed by sensing unit 140.

Sensing time controller 160 outputs a control signal XCON to control sensing unit 140. In response to control signal XCON, sensing unit 140 perform a sensing operation at multiple reading times corresponding to a plurality of reading steps. The reading steps are indicated by a reading step signal RS#, where # represents a natural number less than or equal to x, and x is a natural number greater than or equal to 2.

The reading steps can be performed sequentially or in a random order by apply reading voltages to selected memory cells. For example, where a memory cell storing "1100" is read from a 4-bit multi-level cell (MLC) NAND flash memory device, reading is performed using a first reading voltage in a first reading step RS1. Then, in a second reading step RS2, memory cells that were sensed as off cells in first reading step RS1 are read using a second reading voltage higher than the first reading voltage.

A configuration and operation of sensing time controller 160 will now be described in further detail with reference to FIGS. 2 through 8.

Figure 2:
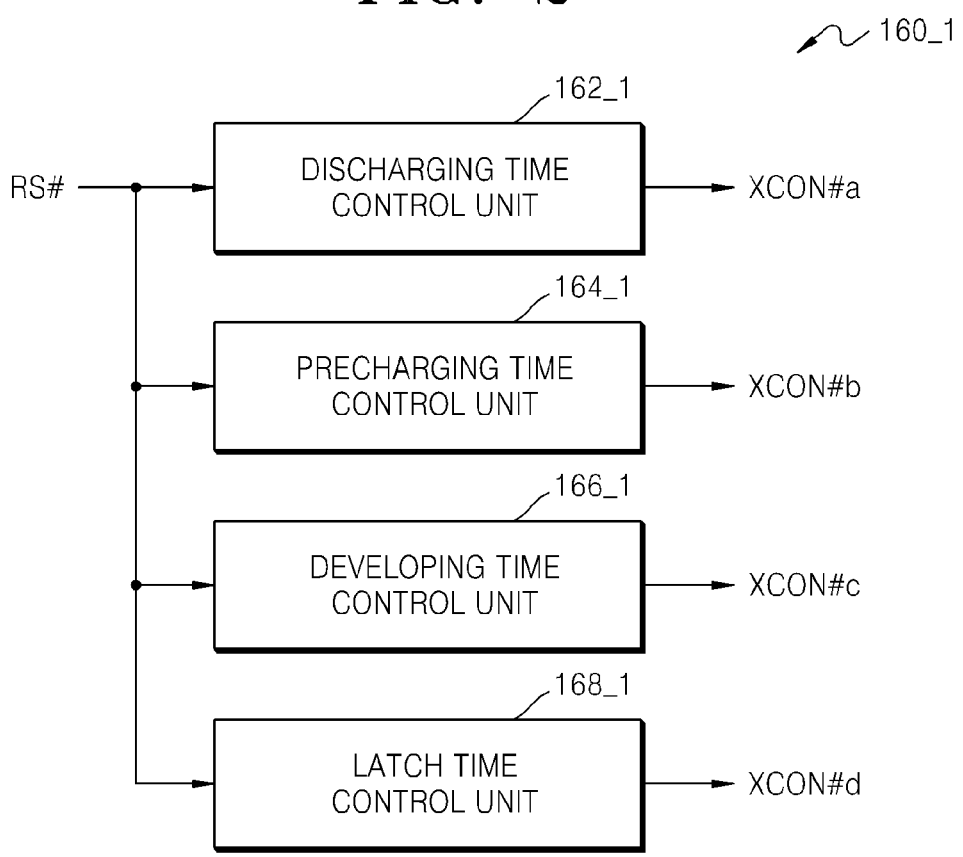
FIGS. 2 through 8 are block diagrams illustrating various embodiments of a sensing time controller of FIG. 1.

FIG. 2 is a block diagram illustrating a first embodiment 160_1 of sensing time controller 160 of FIG. 1.

Referring to FIG. 2, sensing time controller 160_1 comprises a discharging time control unit 162_1, a precharging time control unit 164_1, a developing time control unit 166_1, and a latch time control unit 168_1. Sensing time controller 160_1 controls a reading time in each reading step RS# based on a discharging time, a precharging time, a developing time, and a latch time of various operations described above. Where the reading time of each reading step RS# includes a time according to an operation other than those described above, sensing time controller 160_1 shown in FIG. 2 can be adapted according to the additional time. Similar adaptations can be made to the other embodiments of sensing time controller 160 described below.

Referring to FIGS. 1 and 2, discharging time control unit 162_1 generates a discharging time control signal XCON#a to control sensing unit 140 to perform discharging at a discharging time corresponding to each reading step among the plurality of reading steps. Discharging time control unit 162_1 then transmits discharging time control signal XCON#a to sensing unit 140. For example, discharging time control unit 162_1 can set a discharging time in the first reading step to be shorter than a discharging time in the second reading step.

Precharging time control unit 164_1 generates a precharging time control signal XCON#b to control sensing unit 140 to perform precharging at a precharging time corresponding to each reading step among the plurality of reading steps and transmits the precharging time control signal XCON#b to sensing unit 140. For example, precharging time control unit 164_1 can set a precharging time in the first reading step to be shorter than a precharging time in the second reading step.

Developing time control unit 166_1 generates a developing time control signal XCON#c to control sensing unit 140 to perform developing at a developing time corresponding to each reading step among the plurality of reading steps and transmits the developing time control signal XCON#c to sensing unit 140. For example, developing time control unit 166_1 can set a developing time in the first reading step to be shorter than a developing time in the second reading step.

Latch time control unit 168_1 generates a latch time control signal XCON#d to control sensing unit 140 to perform latching at a latch time corresponding to each reading step among the plurality of reading steps and transmits the latch time control signal XCON#d to sensing unit 140. For example, latch time control unit 168_1 can set a latch time in the first reading step to be shorter than a latch time in the second reading step.

Although it has been described that times taken for discharging, precharging, developing, and latch in a preceding reading step (e.g., the first reading step) can be shorter than times taken for discharging, precharging, developing, and latch in a subsequent reading step (e.g., the second reading step), the inventive concept is not limited to these conditions. To the contrary, at least one of the times taken for discharging, precharging, developing, and latch in the preceding reading step (e.g., the first reading step) can be longer than at least one of the times taken for discharging, precharging, developing, and latch in the subsequent reading step (e.g., the second reading step).

Sensing time controller 160_1 shown in FIG. 2 also illustrates that reading step signal RS# is applied to control units 162_1, 164_1, 166_1, and 168_1 as a single signal, and each of control signals XCON#a, XCON#b, XCON#c, and XCON#d is output from corresponding controller 162_1, 164_1, 166_1, or 168_1 as a single signal. In other words, reading step signal RS# and each of control signals XCON#a, XCON#b, XCON#c, and XCON#d can indicate each reading step and a corresponding control signal with a different logical level. For example, reading step signal RS# can be indicated with logic LOW for the first reading step and logic HIGH for the second reading step. Precharging time control signal XCON#b (#=1) for the first reading step can be indicated with logic LOW, and the precharging time control signal XCON#b (#=2) for the second reading step can be indicated with logic HIGH. However, the inventive concept is not limited to these conditions.

Figure 3:
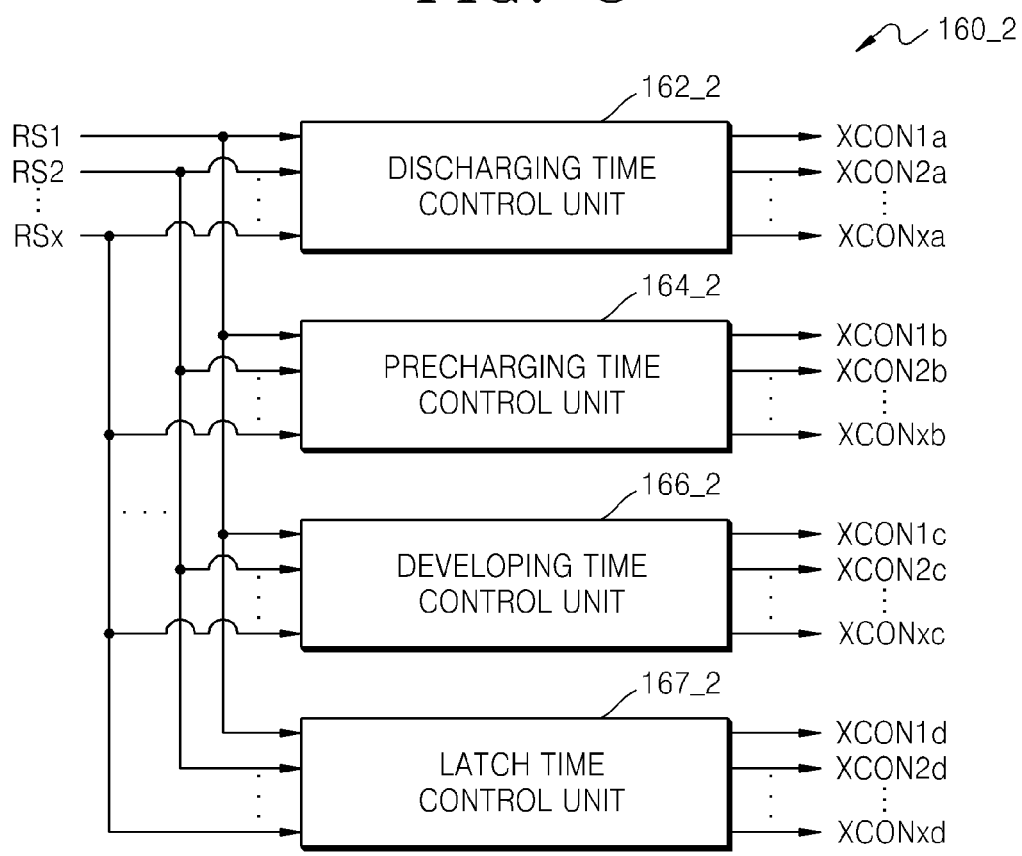
Figure 4:
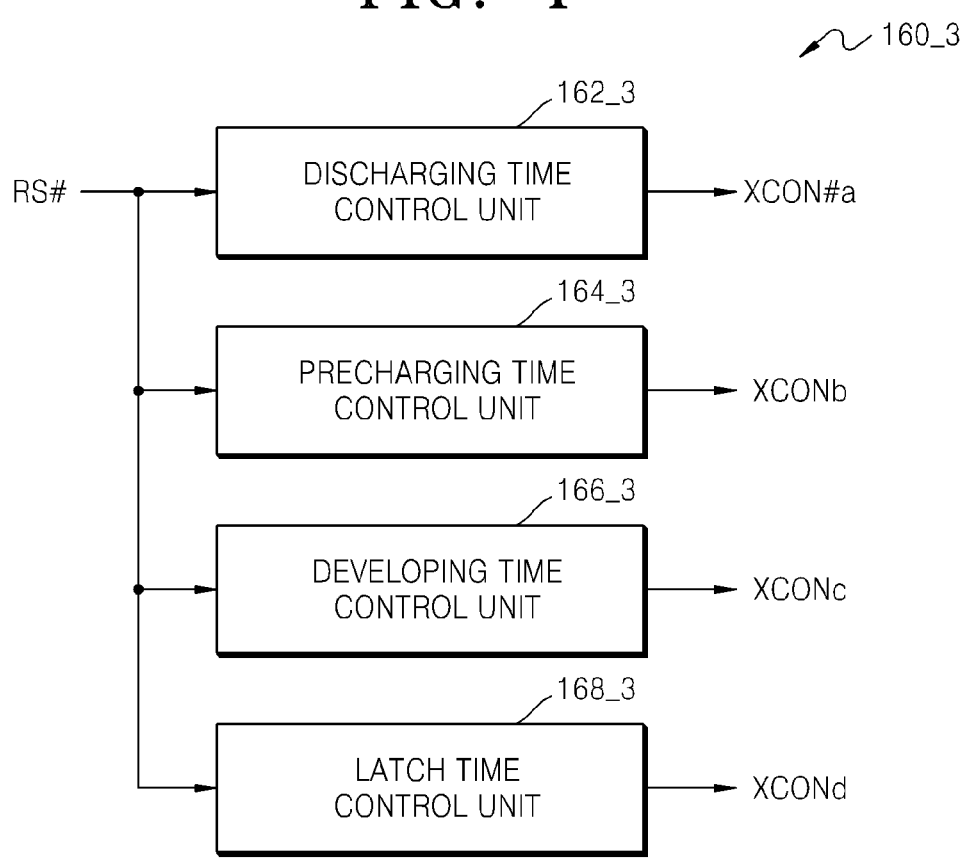

FIG. 3 illustrates a second embodiment 160_2 of sensing time controller 160 of FIG. 1. Referring to FIG. 3, sensing time controller 160_2 generates reading step signals RS1, RS2, . . . , RSx and corresponding control signals as separate signals according to a plurality of reading steps. For example, a first reading step signal RS1 for a first reading step and a second reading step signal RS2 for a second reading step may be applied as separate signals. Similarly, a precharging time control signal XCON1*b* for the first reading step and a precharging time control signal XCON2*b* for the second reading step may be generated as separate signals.

Sensing time controller 160_1 shown in FIG. 2 illustrates that every controller variably sets control signals for a plurality of reading steps. In other words, each controller sets the control signals to have different characteristics in different reading steps. In particular, discharging time control unit 162_1, precharging time control unit 164_1, developing time control unit 166_1, and latch time control unit 168_1 of sensing time controller 160_1 of FIG. 2 variably, or differently, generate discharging time control signal XCON#a, precharging time control signal XCON#b, developing time control signal XCON#c, and latch time control signal XCON#d for every reading step, respectively. However, the inventive concept is not limited to these conditions.

FIGS. 4 through 7 illustrate third through sixth embodiments 160_3, 160_4, 160_5, and 160_6 of sensing time controller 160 of FIG. 1. Each of sensing time controllers 160_3, 160_4, 160_5, and 160_6 can differently generate only one control signal in every reading step. That is, each of sensing time controllers 160_3, 160_4, 160_5, and 160_6 shown in FIGS. 4 through 7 can generate differently only one control signal in every reading step from among a discharging time control signal, a precharging time control signal, a developing time control signal, and a latch time control signal and generate the other control signals with the same value regardless of reading steps. Here, generating differently a control signal in every reading step denotes that a sensing unit receiving a corresponding control signal performs an operation with a different time in a corresponding reading step in response to the corresponding control signal differently generated in the corresponding reading step.

Figure 5:
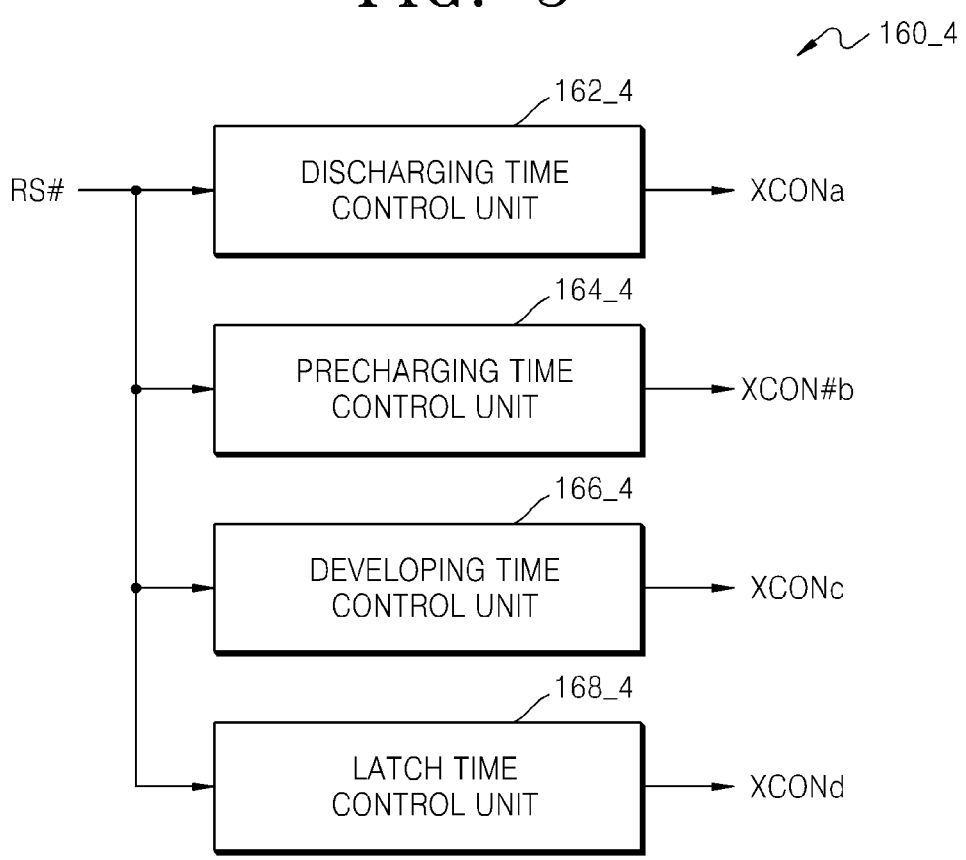
Figure 6:
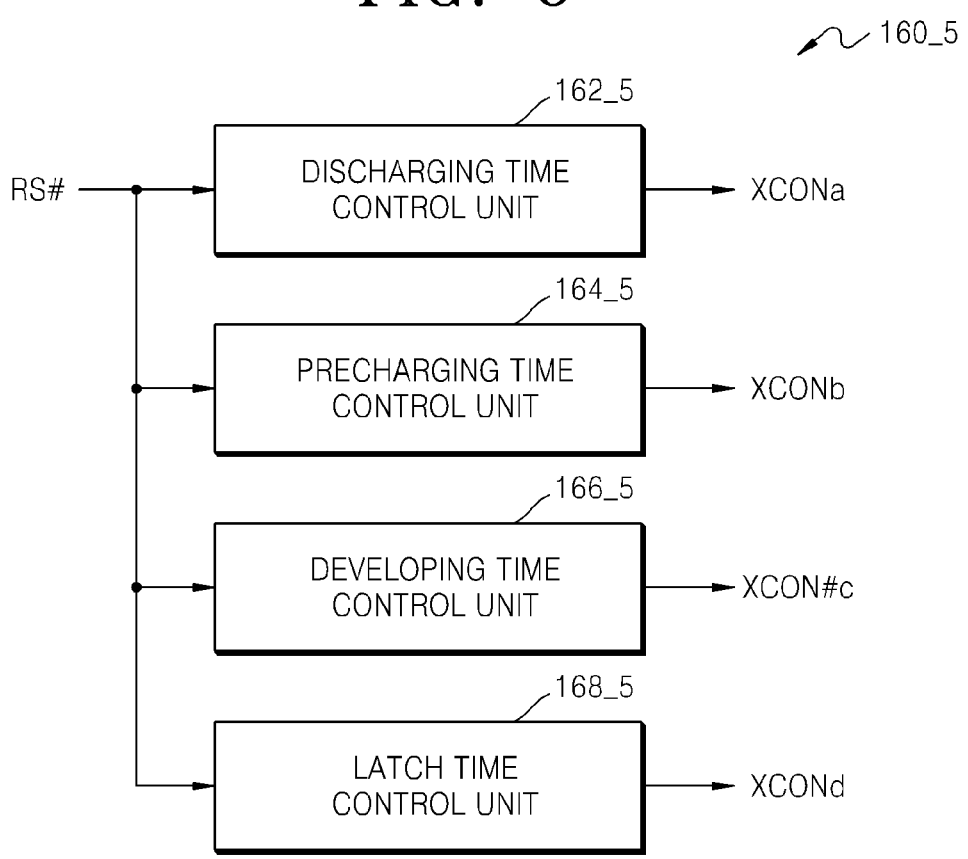
Figure 7:
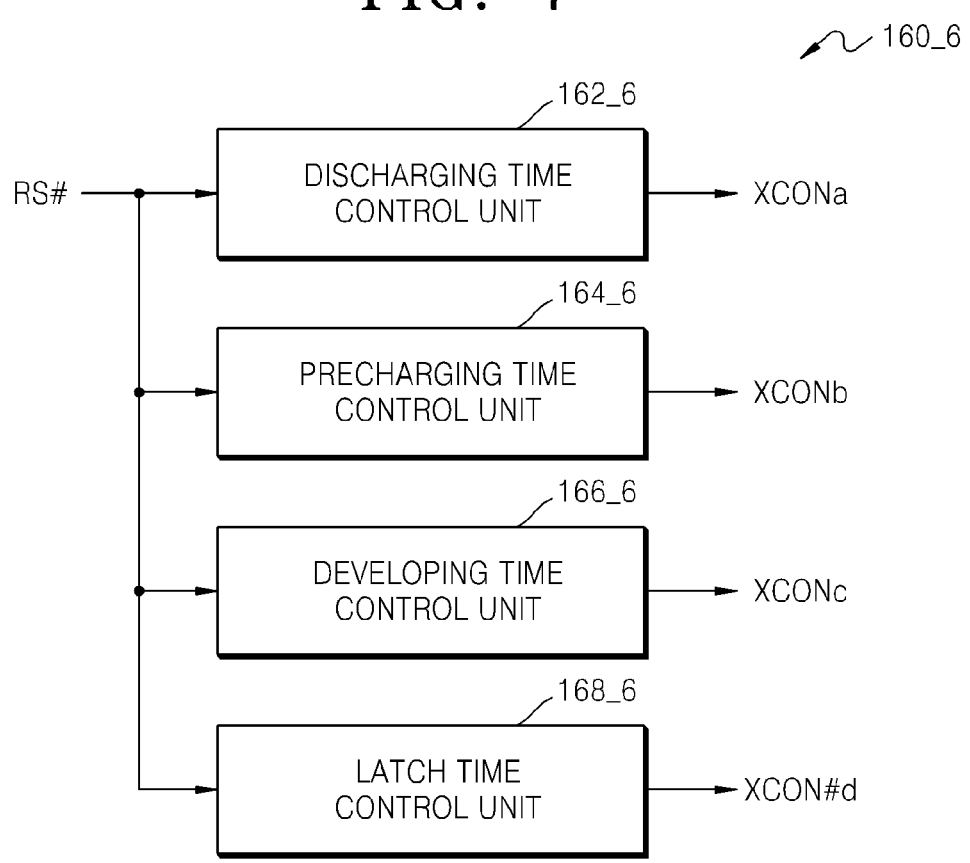

For example, because each of a discharging time control unit 162_4, a developing time control unit 166_4, and a latch time control unit 168_4 of a sensing time controller 160_4 shown in FIG. 5 generates the same control signal regardless of how many reading steps have been performed, sensing unit 140 can perform the same discharging, developing, and latch operations regardless of the reading steps in response to the control signals. On the other hand, a precharging time control unit 164_4 of sensing time controller 160_4 shown in FIG. 5 generates a precharging time control signal XCON#b having a different value according to a reading step, and sensing unit 140 can perform a precharging operation having a different time in every reading step in response to the precharging time control signal XCON#b. In this case, a controller (e.g., discharging time control unit 162_4 of FIG. 5, etc.) generating the same control signal regardless of different reading steps may be omitted from a corresponding sensing time controller.

As described above, semiconductor memory device 100 performs a reading operation of data using a plurality of reading steps, and it individually sets a reading time for each reading step. This can increase its performance while retaining its reliability.

Hereinafter, a flash memory device will be described as an example of a semiconductor memory device according to an embodiment of the inventive concept. The flash memory device uses two reading steps to perform a reading operation corresponding to a single reading command. The two reading steps include a coarse read step and a fine read step. After performing the reading operation with an arbitrary reading voltage in the coarse read step in response to a reading command, a reading operation of memory cells, i.e., off-cells, from which reading has not been performed in the coarse read step is performed using a reading voltage that is greater than the arbitrary reading voltage of the fine read step.

Figure 8:
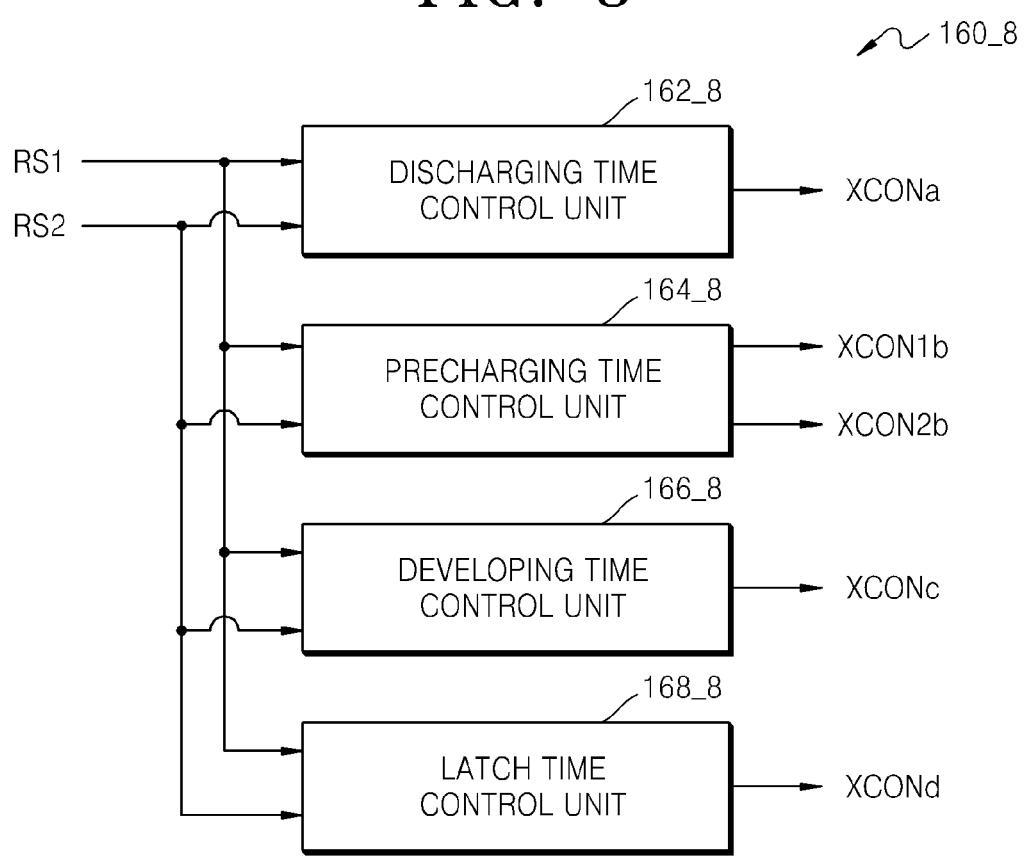

FIG. 8 is a diagram illustrating a sensing time controller of a semiconductor memory device performing a reading operation corresponding to a single reading command through two reading steps, i.e., the coarse read step and the fine read step. Sensing time controller 160_8 of FIG. 8 comprises a discharging time control unit 162_8, a precharging time control unit 164_8, a developing time control unit 166_8, and a latch time control unit 168_8.

Figure 9:
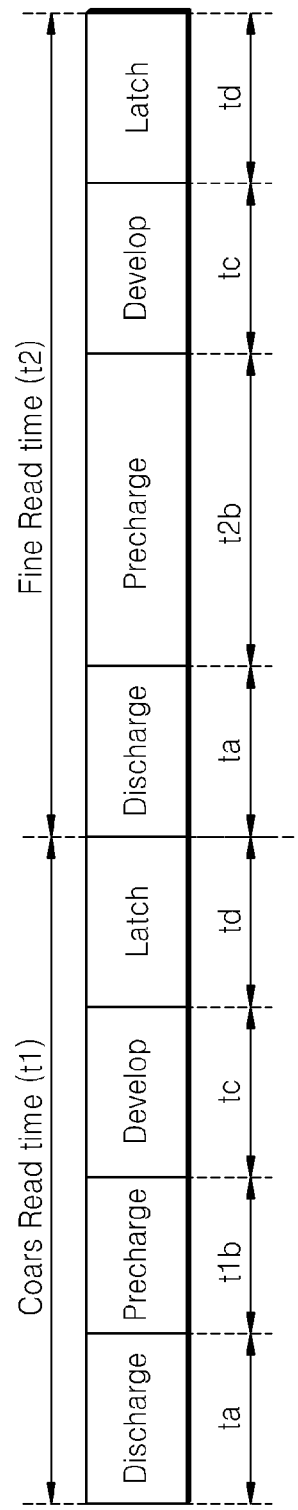

Sensing time controller 160_8 differently generates a first precharging time control signal XCON1$b$ and a second precharging time control signal XCON2$b$ so as to differently set only a precharging time of the coarse read step and a precharging time of the fine read step. Accordingly, as shown in FIG. 9, a reading time t1 in the coarse read step and a reading time t2 in the fine read step are differently set by a difference (t1$b$–t2$b$) between a precharging time t1$b$ in the coarse read step and a precharging time t2$b$ in the fine read step.

FIG. 10 shows conceptual diagrams of a parasitic capacitance according to precharging or non-precharging between adjacent bitlines.

Referring to FIG. 10A, where only a corresponding bitline BLi is precharged and a ground voltage is applied to adjacent bitlines BLi–1 and BLi+1, adjacent parasitic capacitance Ccp1 existing between the corresponding bitline BLi and the adjacent bitlines BLi–1 and BLi+1 is added to self-parasitic capacitance Cself existing in each of bitlines BLi–1, BLi, and BLi+1.

Referring to FIG. 10B, where the corresponding bitline BLi and one adjacent bitline BLi–1 are precharged and the ground voltage is applied to the remaining adjacent bitline BLi+1, adjacent parasitic capacitance Ccp1 existing between the corresponding bitline BLi and the adjacent bitline BLi+1 to which the ground voltage is applied is added to self-parasitic capacitance Cself existing in each of bitlines BLi–1, BLi, and BLi+1.

Referring to FIG. 10C, where all of bitlines BLi–1, BLi, and BLi+1 are precharged, only self-parasitic capacitance Cself exists in each of bitlines BLi–1, BLi, and BLi+1, and no adjacent parasitic capacitance Ccp1 exists between the corresponding bitline BLi and the adjacent bitline BLi–1 or BLi+1.

As described above, parasitic capacitance on bitlines increases according to precharging or non-precharging of the bitlines. Because the adjacent parasitic capacitance Ccp1 is much greater than the self-parasitic capacitance Cself, the capacitance in the examples of FIGS. 10A and 10B in which only a portion of bitlines is precharged is significantly greater than that of FIG. 10C in which all bitlines are precharged. Because a precharging time is determined by capacitance of bitlines, a precharging time of FIG. 10A or 10B in which only a portion of bitlines is precharged is greater than that of FIG. 10C in which all bitlines are precharged.

Referring to FIGS. 8 through 10, sensing unit 140 can precharge all bitlines of FIG. 10C in response to the first precharging time control signal XCON1$b$ in the coarse read step. On the other hand, sensing unit 140 can precharge only off-cells remaining in the coarse read step as shown in FIG. 10A or 10B in response to the second precharging time control signal XCON2$b$ in the fine read step. Accordingly, precharging time t1$b$ of the coarse read step can be set to be shorter than precharging time t2$b$ of the fine read step.

Figure 11:
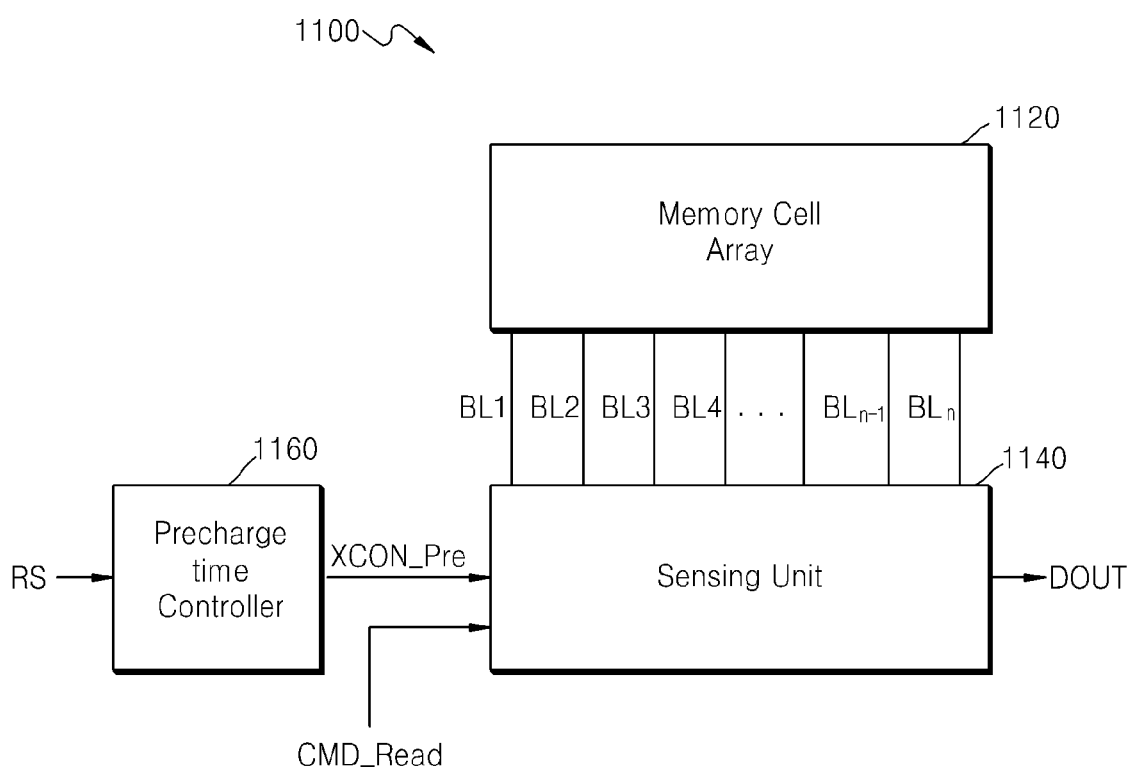
FIGS. 11 and 12 are block diagrams of a semiconductor memory device according to another embodiment of the inventive concept.

FIG. 11 is a block diagram of a semiconductor memory device 1100 according to another embodiment of the inventive concept.

Semiconductor memory device 1100 is similar to semiconductor memory device 100 of FIG. 1, except that it comprises a precharge time controller 1160 instead of sensing time controller 160 of FIG. 1. Precharge time controller 1160 incorporates only the precharging time control unit among the control units included in sensing time controller 160 of FIG. 1 to control only a precharging time to be differently set according to a reading step.

Although only a reading operation of a semiconductor memory device has been described according to an embodiment of the inventive concept, the inventive concept is not limited to the reading operation.

Figure 12:
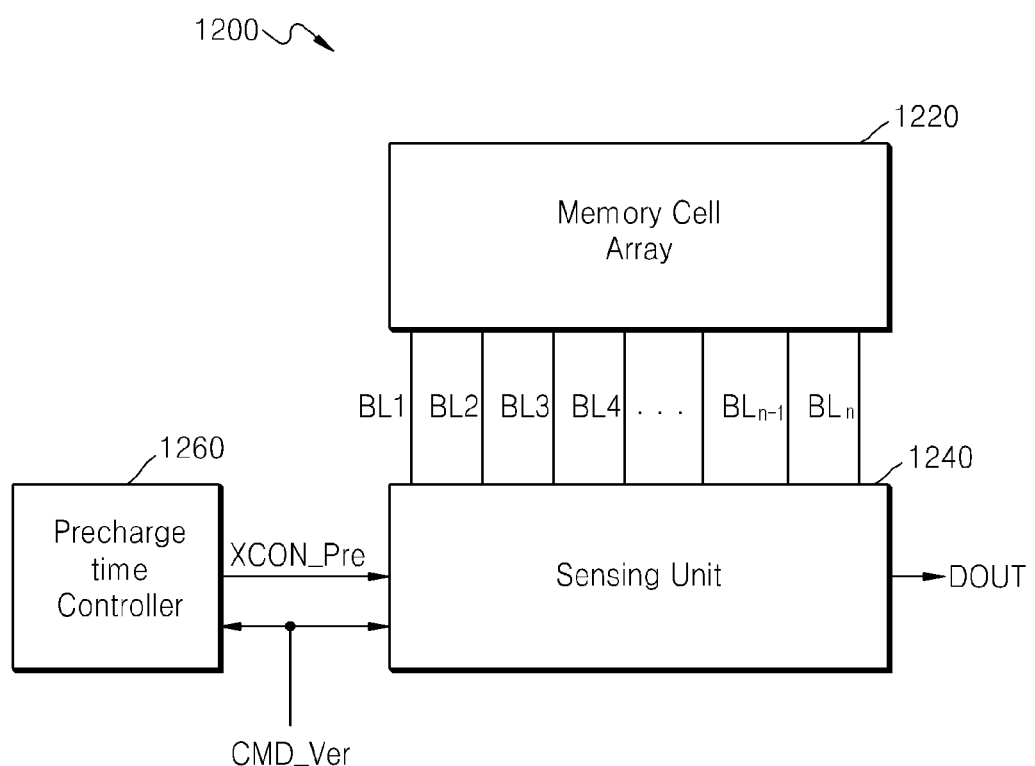

FIG. 12 illustrates a semiconductor memory device 1200 according to another embodiment of the inventive concept. Semiconductor memory device 1200 is a flash memory device that performs a single verifying operation through a plurality of verifying steps. A verifying operation in the flash memory device reads programmed data and detects whether the programmed data is identical to data to be programmed. That is, the verifying operation includes a reading operation. Meanwhile, semiconductor memory device 1200 reads programmed data in a reading operation of a semiconductor memory device as shown in FIG. 1. That is, a sensing unit 1240 of semiconductor memory device 1200 has verifying times corresponding to the plurality of verifying steps when performing a verifying operation in response to a verifying command CMD_Ver. In certain embodiments, semiconductor memory device 100 of FIG. 1 can be modified to perform the same operation as the semiconductor memory device of FIG. 12.

Figure 13:
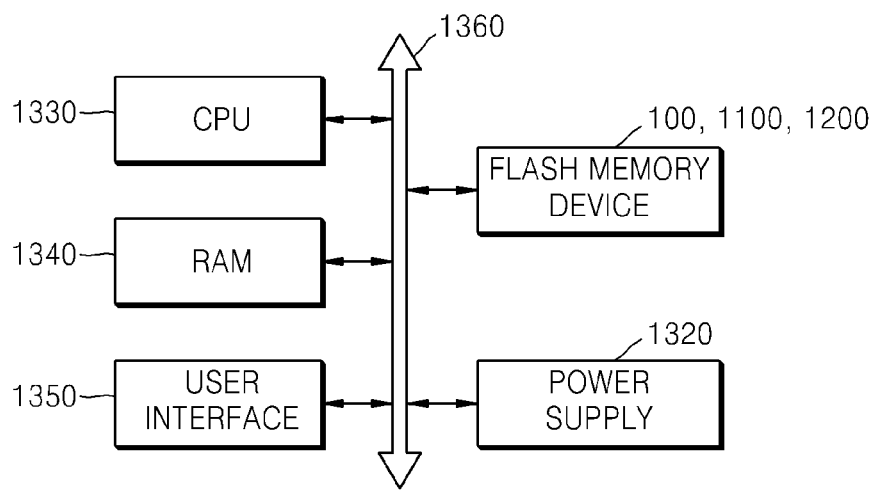
FIG. 13 is a block diagram of a computing system comprising a semiconductor memory device according to an embodiment of the inventive concept.

FIG. 13 is a block diagram of a computing system 1300 comprising a semiconductor memory device according to an embodiment of the inventive concept.

Referring to FIG. 13, computing system 1300 comprises a microprocessor (CPU) 1330, a user interface 1350, and semiconductor memory device 100, 1100, or 1200, which are electrically connected to a bus 1360. Semiconductor memory device 100, 1100, or 1200 each store N-bit data (N≥1) that has been processed or is to be processed by microprocessor 1330. Computing system 1300 may further include a random access memory (RAM) 1340 and a power supply 1320.

Where computing system 1300 is a mobile device, computing system 1300 may further comprise a battery for supplying an operational voltage thereof and a modem such as a baseband chipset. Computing system 1300 can further comprise other features, such as an application chip set, a camera image processor (CIP), and a mobile dynamic RAM (DRAM).

In some embodiments, semiconductor memory device 100, 1100, or 1200 forms a solid-state drive (SSD) that uses a nonvolatile memory to store data.

Figure 14:
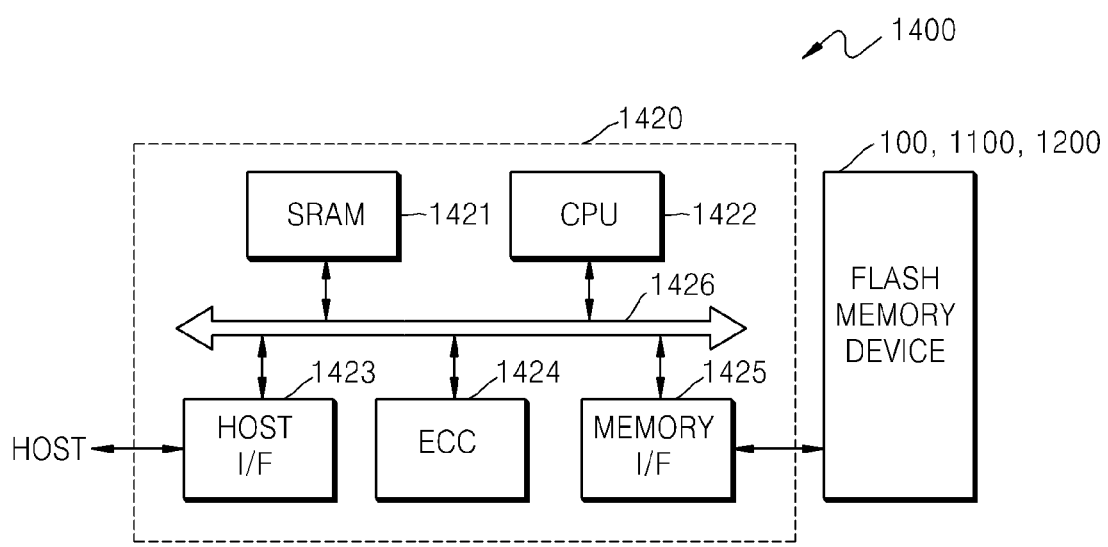
FIG. 14 is a block diagram of a memory card comprising a semiconductor memory device according to an embodiment of the inventive concept.

FIG. 14 is a block diagram of a memory card comprising a semiconductor memory device according to an embodiment of the inventive concept.

Referring to FIG. 14 the memory card comprises a controller 1420 and semiconductor memory device 100, 1100, or 1200. Controller 1420 can be configured to communicate with the outside (e.g., a host) through one of various interface protocols, such as universal serial bus (USB), MIDI machine control (MMC), peripheral component interconnect express (PCI-E), serial advanced technology attachment (SATA), parallel advanced technology attachment (PATA), small computer system interface (SCSI), enhanced small device interface (ESDI), and integrated device electronics (IDE).

Semiconductor memory devices according to embodiments of the inventive concept can be packaged using various types of packages or package configurations, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline integrated circuit (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

While the inventive concept has been particularly described above with reference to various embodiments, it will be understood that various changes in form and details may be made to the embodiments without departing from the scope of the following claims.

What is claimed is:

1. A semiconductor memory device, comprising:
a memory cell array including a plurality of memory cells, each memory cell being configured to store data;
a sensing unit configured to perform a reading operation on data stored in the memory cell array by sensing at least one corresponding memory cell through a plurality of reading steps in response to a single reading command, wherein the plurality of reading steps comprises a coarse read step that performs reading with a first reading voltage, and a fine read step that performs reading with a second reading voltage higher than the first reading voltage for at least one memory cell sensed as an OFF-cell during the coarse read step, and wherein reading time taken by each reading step comprises a precharging time taken to precharge bitlines of memory cell array, a developing time taken to develop a voltage of a sensing node connected to a bitline connected to a corresponding memory cell of the at least one corresponding memory cell among the precharged bitlines, and a latch time taken to latch the developed bitline voltage; and
a sensing time controller configured to differently control the precharge time taken by the coarse reading step and the fine reading step performed by the sensing unit.

2. The semiconductor memory device of claim 1, wherein the sensing time controller comprises a precharging time control unit configured to generate a precharging time control signal so that the precharging time of the coarse read step is shorter than the precharging time of the fine read step.

3. The semiconductor memory device of claim 2, wherein, in the coarse read step, the sensing unit performs precharging of all bitlines of the memory cell array at the same time in response to the precharging time control signal, and in the fine read step, the sensing unit performs precharging of at least one bitline connected to the off-cell in response to the precharging time control signal.

4. A semiconductor memory device, comprising:
a memory cell array including a plurality of memory cells, each memory cell being configured to store data;
a sensing unit configured to perform a reading operation on data stored in the memory cell array by sensing at least one corresponding memory cell through a plurality of reading steps in response to a single reading command, wherein the plurality of reading steps use different respective read voltages; and
a sensing time controller configured to variably control a reading time taken by each reading step performed by the sensing unit,
wherein the sensing unit is further configured to perform a verifying operation of data stored in the memory cell array by sensing at least one corresponding memory cell through a plurality of verifying steps in response to a single verifying command,
wherein the sensing time controller is further configured to control a verifying time taken by each verifying step of the sensing unit to vary in each verifying step,
wherein the verifying time taken by each verifying step comprises a discharging time taken to discharge bitlines of the memory cell array, a precharging time taken to precharge the discharged bitlines, a developing time taken to develop a voltage of at least one bitline connected to a corresponding memory cell of the at least one corresponding memory cell among the precharged bitlines, and a latch time taken to latch the developed voltage,
wherein the semiconductor memory device is a flash memory device, and wherein the plurality of verifying steps comprises:
a coarse read step of verifying with a first verifying voltage; and
a fine read step of verifying with a second verifying voltage higher than the first verifying voltage for at least one memory cell sensed as an off-cell during the coarse read step.

5. The semiconductor memory device of claim 4, wherein the sensing time controller comprises a precharging time control unit configured to generate a precharging time control signal so that a precharging time in the coarse read step is shorter than a precharging time in the fine read step.

6. The semiconductor memory device of claim 5, wherein, in the coarse read step, the sensing unit performs precharging of all bitlines of the memory cell array at the same time in response to the precharging time control signal, and in the fine read step, the sensing unit performs precharging of at least one bitline connected to the off-cell in response to the precharging time control signal.

7. A semiconductor memory system, comprising:
a non-volatile memory device comprising a memory cell array including a plurality of memory cells, each memory cell being configured to store data;
a sensing unit configured to perform a reading operation of data stored in the memory cell array through a plurality of reading steps according to a single reading command, wherein the plurality of reading steps comprises a coarse read step that performs reading with a first reading voltage applied to a wordline, and a fine read step that performs reading with a second reading voltage higher than the first reading voltage and applied to the wordline for at least one memory cell sensed as an off-cell during the coarse read step; and
a sensing time controller configured to control a time of a bitline precharging operation included in the coarse read step and the fine read step performed by the sensing unit to vary between the course read step and the fine read step.

8. The semiconductor memory system of claim 7, wherein the time of the bitline precharging operation included in the coarse read step is longer than the time of the bitline precharging operation included in the fine read step.

9. The semiconductor memory system of claim 7, wherein each of the coarse read step and the fine read step requires a reading time that comprises:
a discharging time taken to discharge bitlines of the memory cell array;
the precharging time taken to precharge the discharged bitlines;
a developing time taken to develop a voltage of at least one bitline connected to a corresponding memory cell of the at least one corresponding memory cell among the precharged bitlines; and
a latch time taken to latch the developed voltage,
wherein the sensing time controller comprises at least one of:
a discharging time control unit configured to control the discharging time to be variably set for a corresponding reading step of the coarse read step and the fine read step in response to a reading step signal indicating the corresponding reading step;
a precharging time control unit configured to control the precharging time to be variably set for the corresponding reading step in response to the reading step signal;
a developing time control unit configured to control the developing time to be variably set for the corresponding reading step in response to the reading step signal; and
a latch time control unit configured to control the latch time to be differently set depending on the corresponding reading step in response to the reading step signal.

* * * * *